US010020366B2

(12) United States Patent
Mahadik et al.

(10) Patent No.: US 10,020,366 B2
(45) Date of Patent: Jul. 10, 2018

(54) REMOVAL OF BASAL PLANE DISLOCATIONS FROM SILICON CARBIDE SUBSTRATE SURFACE BY HIGH TEMPERATURE ANNEALING AND PRESERVING SURFACE MORPHOLOGY

(71) Applicant: The United States of America, as represented by the Secretary of the Navy, Washington, DC (US)

(72) Inventors: Nadeemullah A. Mahadik, Springfield, VA (US); Robert E. Stahlbush, Silver Spring, MD (US); Eugene A. Imhoff, Washington, DC (US); Marko J. Tadjer, Springfield, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/272,736

(22) Filed: Sep. 22, 2016

(65) Prior Publication Data

US 2017/0092724 A1  Mar. 30, 2017

Related U.S. Application Data

(60) Provisional application No. 62/232,642, filed on Sep. 25, 2015.

(51) Int. Cl.
| | |
|---|---|
| *H01L 29/15* | (2006.01) |
| *H01L 31/0312* | (2006.01) |
| *H01L 29/16* | (2006.01) |
| *H01L 21/02* | (2006.01) |
| *H01L 21/324* | (2006.01) |

(52) U.S. Cl.
CPC ...... *H01L 29/1608* (2013.01); *H01L 21/0262* (2013.01); *H01L 21/02378* (2013.01); *H01L 21/02433* (2013.01); *H01L 21/02529* (2013.01); *H01L 21/02658* (2013.01); *H01L 21/324* (2013.01)

(58) Field of Classification Search
CPC .......... H01L 29/1608; H01L 21/02658; H01L 21/02433; H01L 21/02378; H01L 21/0262; H01L 21/324; H01L 21/02529
See application file for complete search history.

(56) References Cited

U.S. PATENT DOCUMENTS

| | | | |
|---|---|---|---|
| 9,129,799 B2 * | 9/2015 | Mahadik | C30B 29/36 |
| 2014/0175461 A1 * | 6/2014 | Momose | C30B 25/20 |
| | | | 257/77 |
| 2015/0129897 A1 * | 5/2015 | Sudarshan | H01L 21/02658 |
| | | | 257/77 |

* cited by examiner

*Primary Examiner* — Stephen W Smoot
*Assistant Examiner* — Vicki B Booker
(74) *Attorney, Agent, or Firm* — US Naval Research Laboratory; Rebecca L. Forman (57) ABSTRACT

A method and device including adding a protective layer on the surface of a substrate, annealing the substrate at a temperature approximately greater or equal to 1850° C., removing the protective layer from the surface of the substrate after the annealing, and growing a first epilayer on the substrate after the removing of the protective layer, wherein the first epilayer is grown without attempting to prevent the basal plane dislocations to propagate in the first epilayer when growing the first epilayer, and wherein the first epilayer is free of the basal plane dislocations.

20 Claims, 7 Drawing Sheets

REMOVAL OF BASAL PLANE DISLOCATIONS FROM SILICON CARBIDE SUBSTRATE SURFACE BY HIGH TEMPERATURE ANNEALING AND PRESERVING SURFACE MORPHOLOGY

CROSS-REFERENCE TO RELATED APPLICATIONS

This application claims priority to U.S. Provisional Patent Application No. 62/232,642 filed on Sep. 25, 2015, the complete disclosure of which, in its entirety, is herein incorporated by reference.

GOVERNMENT INTEREST

The embodiments described herein may be manufactured, used, and/or licensed by or for the United States Government without the payment of royalties thereon.

BACKGROUND

Technical Field

The embodiments herein generally relate to semiconductor technology, and more particularly to defect removal in semiconductor substrates.

Description of the Related Art

Mitigation of basal plane dislocations (BPD) in the silicon carbide (SiC) drift layers is important for reliable and high performance operation of SiC high power devices because they form stacking faults during device operation, which leads to forward voltage degradation. There are methods to reduce the BPD density in SiC epilayers during the epilayer growth. For example, U.S. Pat. No. 9,129,799, the complete disclosure of which is incorporated herein in its entirety, describes a BPD removal in SiC epitaxial layers.

SUMMARY

In view of the foregoing, an embodiment herein provides a method for preventing basal plane dislocations on a surface of a silicon carbide substrate to propagate to a first epilayer grown on the substrate, the method comprising adding a protective layer on the surface of the substrate; annealing the substrate at a temperature approximately greater or equal to 1850° C., wherein the annealing embeds the basal plane dislocations within the substrate and below the surface of the substrate; removing the protective layer from the surface of the substrate after the annealing; and growing a first epilayer on the substrate after the removing of the protective layer, wherein the first epilayer is grown without attempting to prevent the basal plane dislocations to propagate in the first epilayer when growing the first epilayer, and wherein the first epilayer is free of the basal plane dislocations.

The protective layer may comprise a carbon layer. The silicon carbide substrate may comprise a 4° offcut, with an approximately 100 mm diameter, n-type 4H-SiC substrate. The growing the first epilayer may comprise using a chemical vapor deposition growth process. The first epilayer may be at least approximately 20 μm thick. The annealing to approximately greater or equal to 1850° C. may further comprise annealing the substrate for approximately 10 minutes in an induction high temperature furnace with Ar ambient at approximately 200 Torr.

The method may further comprise growing a second epilayer on the first epilayer, wherein the second epilayer may be grown without attempting to prevent the basal plane dislocations to propagate in the second epilayer when growing the first epilayer, and wherein the second epilayer may be free of the basal plane dislocations. The growing of the second epilayer may comprise using a chemical vapor deposition growth process. The second epilayer may be at least approximately 20 μm thick.

An embodiment herein provides a method for preventing basal plane dislocations on a surface of a silicon carbide substrate to propagate to an epilayer grown on the substrate, the method comprising adding a surface protective layer on the surface of the substrate; annealing the substrate at a temperature approximately greater or equal to 1850° C., wherein the annealing embeds the basal plane dislocations within the substrate and below the surface of the substrate; and growing a first epilayer on the substrate after the annealing, wherein the annealing prevents the basal plane dislocations to propagate into the first epilayer.

The basal plane dislocations may propagate as threading edge dislocations in the first epilayer during the growing of the first epilayer in any desired thickness of the first epilayer. The thickness of the first epilayer may be at least approximately 10 μm. A roughness of a surface of the epilayer may be preserved. The method may further comprise growing a second epilayer on the first epilayer, wherein the threading edge dislocations in the first epilayer may propagate as successive threading edge dislocations in the second epilayer during the growing of the second epilayer. The growing of the first epilayer and the growing of the second epilayer may comprise using a chemical vapor deposition growth process. The annealing to approximately greater or equal to 1850° C. may further comprise annealing the substrate for approximately 10 minutes in an induction high temperature furnace with Ar ambient at approximately 200 Torr.

An embodiment herein provides a device comprising a silicon carbide substrate, wherein the substrate comprises basal plane dislocations, and wherein the basal plane dislocations are embedded below a surface of the substrate by annealing the substrate at approximately at least 1850° C.; and a first epilayer on the silicon carbide substrate, wherein the first epilayer is grown on the substrate after the annealing of the substrate, and wherein the first epilayer is free from the basal plane dislocations. The basal plane dislocations in the substrate may be converted to threading edge dislocations within the first epilayer growth. The device may further comprise a second epilayer over the first epilayer, wherein the second epilayer is free from the basal plane dislocations. The first epilayer may be at least approximately 10 μm thick.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

An embodiment herein provides a method to convert electrically maligned basal plane dislocations (BPD) at the Silicon Carbide (SiC) substrate surface to electrically benign threading edge dislocations (TED) or threading dislocation (TD), while preserving the surface morphology of any epilayer grown on top of it. The process may embed the BPDs below the substrate surface by annealing the substrate. Using this approach, any successive SiC epilayer growth on such substrates will be free of BPDs propagating from the substrates, and the BPDs in the substrate may only propagate as TDs in the successive epilayers grown on the substrate. An embodiment herein utilizes a surface protective coating and a high temperature annealing process on SiC substrates to embed the BPDs within the SiC substrate prior to epilayer growth. In this method, because no further annealing will be needed to remove BPDs from the eplilayer, the surface morphology of the epilayer is preserved.

It is also desirable to grow BPD-free epilayers with different thicknesses. An embodiment herein provides a BPD to TED conversion method on the surface of the SiC substrate, before any epitaxial layers are grown. In this embodiment, the BPDs present at the substrate surface may be converted to TEDs and propagate as TEDs in the epilayers during epigrowth. This may enable successive epilayer growth of any desired thickness of BPD free epilayers on the surface of the SiC substrates. By mitigating the BPDs in the SiC substrates, embodiments herein eliminate a need for annealing an epilayer to remove BPDs from the epilayer. Annealing an epilayer may cause damage to the surface of the epilayer, therefore embodiments herein preserve the surface morphology of the epilayer.

Embodiments herein make manufacturing high power density and high voltage SiC devices possible. Further, the embodiments herein may be used to perform high temperature treatments to SiC substrates to improve carrier lifetime in n-type SiC substrates. A process of thermal annealing provided herein may accomplish these aspects of the embodiments.

Referring now to the drawings, and more particularly to FIGS. 1A through 5, where similar reference characters denote corresponding features consistently throughout the figures, there are shown preferred embodiments.

Figure 1A:
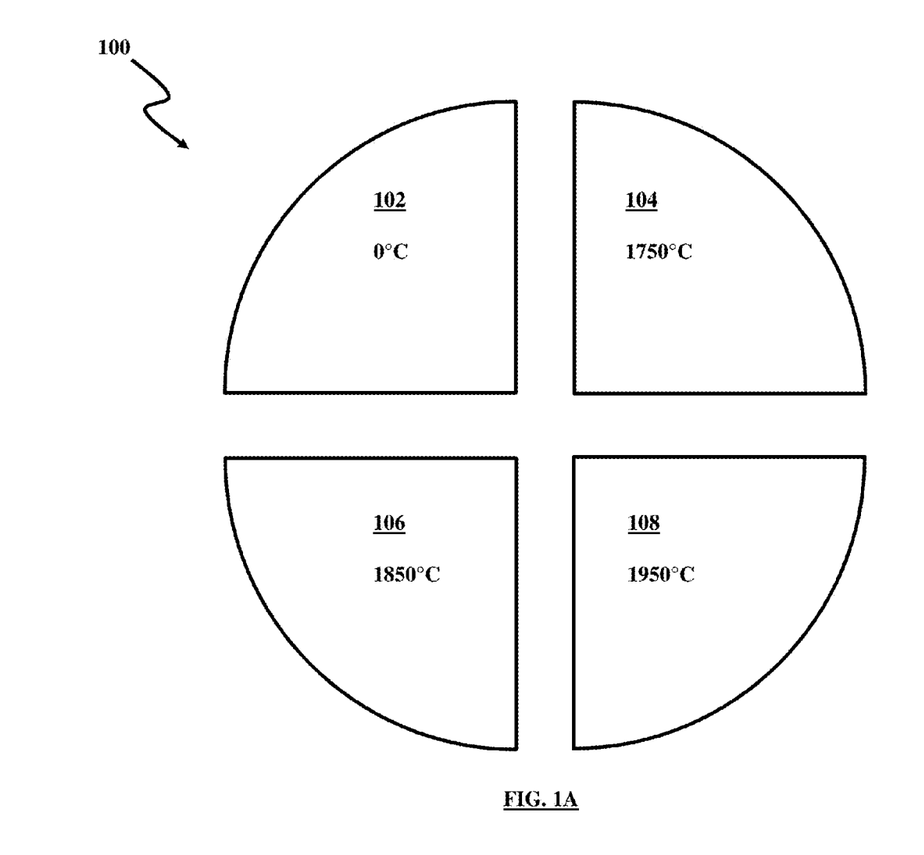
FIG. 1A is a schematic diagram of a semiconductor wafer with different substrate annealing conditions according to an embodiment herein.

FIG. 1A is a schematic diagram of a SiC semiconductor wafer 100 with different substrate annealing conditions according to an embodiment herein. In an embodiment, 4° offcut, 100 mm diameter, n-type 4H-SiC substrates are used. The substrate is divided into quarters 102, 104, 106, and 108. In an embodiment, the quarters 104, 106, and 108 are each carbon capped. In an embodiment, quarter 102 is not annealed. Quarter 104 may be annealed at 1750° C. for 10 mins in an induction high temperature furnace with Argon (Ar) ambient at 200 Torr. Quarter 106 may be annealed at 1850° C. for 10 mins in an induction high temperature furnace with Ar ambient at 200 Torr. Quarter 108 may be annealed at 1950° C. for 10 mins in an induction high temperature furnace with Ar ambient at 200 Torr.

Figure 1B:
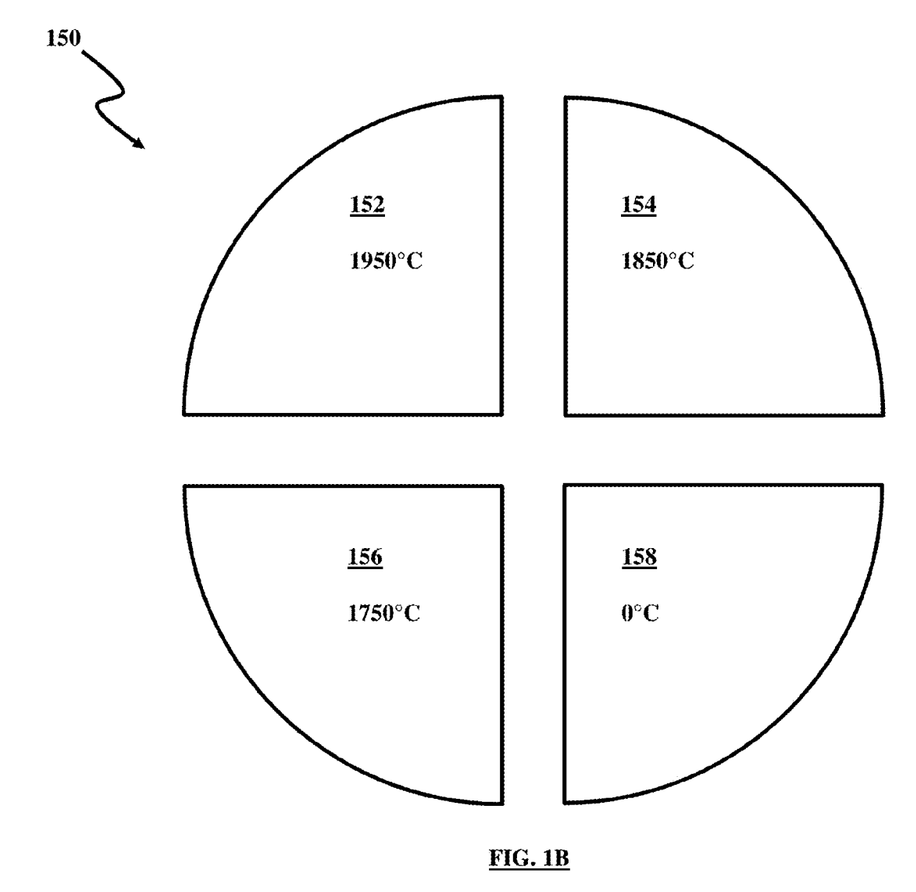
FIG. 1B is a schematic diagram of a semiconductor wafer with different substrate annealing conditions according to an embodiment herein.

FIG. 1B is a schematic diagram of a semiconductor wafer 150 with different substrate annealing conditions according to an embodiment herein. In an embodiment, 4° offcut, 100 mm diameter, n-type 4H-SiC substrates are used. The substrate is divided into quarters 152, 154, 156, and 158. In an embodiment, the quarters 152, 154, and 156 are each carbon capped. In an embodiment, quarter 152 may be annealed at 1950° C. for 10 mins in an induction high temperature furnace with Ar ambient at 200 Torr. Quarter 154 may be annealed at 1850° C. for 10 mins in an induction high temperature furnace with Ar ambient at 200 Torr. Quarter 156 may be annealed at 1750° C. for 10 mins in an induction high temperature furnace with Ar ambient at 200 Torr. In an embodiment, quarter 158 is not annealed.

FIGS. 2A through 2D, with reference to FIGS. 1A and 1B, are schematic diagrams illustrating a substrate 200 at different stages of annealing and epilayer growth according to an embodiment herein. Substrate 200 may be any of the quarters 102, 104, 106, and 108 in FIG. 1A, or any of the quarters 152, 154, 156, and 158 in FIG. 1B.

Figure 2A:
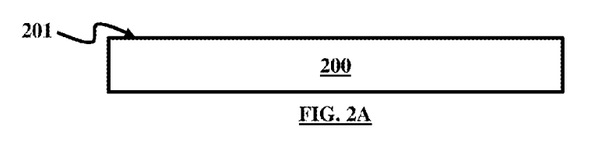
FIG. 2A is a schematic diagram illustrating a substrate containing BPD, according to an embodiment herein.
Figure 2B:
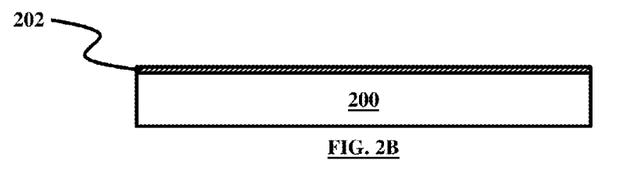
FIG. 2B is a schematic diagram illustrating a substrate coated with a carbon layer according to an embodiment herein.

FIG. 2A is a schematic diagram illustrating the substrate 200 having a surface 201. FIG. 2B is a schematic diagram illustrating a carbon cap layer 202 added to the substrate 200. The process of adding the carbon cap layer 202 on the quarter 200 may be developed using Microchemicals GmbH's AZ® 4620 photo-resist, densified at 1100° C./30 minutes. The process may be optimized to create a cap that withstands the high annealing temperature. In an embodiment, the substrate 200 with the carbon layer 202 is annealed at 1850° C. or higher. The annealing process causes the BPDs in the surface 201 of the substrate 200 to glide back into the substrate, leaving TDs in the surface 201 of the substrate 200.

Figures 2C, 2D:
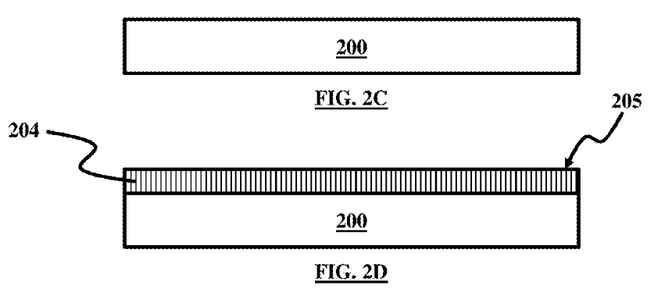
FIG. 2C is a schematic diagram illustrating an annealed substrate after removing the carbon cap according to an embodiment herein.
FIG. 2D is a schematic diagram illustrating an annealed substrate with an epilayer growth according to an embodiment herein.

The carbon cap layer 202 may be used to protect the surface 201 of the substrate 200 against heat during the annealing process and avoid silicon sublimation. After the annealing process, the carbon cap layer 202 is removed. FIG. 2C is a schematic diagram illustrating the substrate 200 after the annealing process and after the carbon cap layer 202 is removed.

FIG. 2D is a schematic diagram illustrating an epilayer 204 grown on the substrate 200. In an embodiment, the epilayer 204 may be a 20 µm epilayer. In an embodiment, the epilayer 204 may have a thickness greater than 20 µm. In the embodiments herein, because the surface 201 of the substrate 200 is BPD free after the annealing process, the epilayer 204 may be grown with any epitaxial process, without attempting to suppress BPDs in the epilayer. Therefore, by eliminating any additional steps for preventing BPD propagation during growth of the epilayer 204, or removing any BPDs after the epilayer 204 is grown, the embodiments herein reduce the time and cost of providing a BPD free epilayer 204.

For example, in some conventional methods, an epilayer grown on a substrate would need to be annealed to remove any BPDs from the epilayer. As the thickness of the epilayer increases, the epilayer needs to be exposed to heat for longer periods of time for removal of the BPDs. This process may therefore become time consuming. Also, the exposure of the epilayer to high temperature for a long period of time may deteriorate the surface of the epilayer. For example, exposure to high temperature for an extended time may increase the roughness of the epilayer surface. The embodiments herein remove the need to anneal the epilayer, and therefore allow growing an epilayer with any desired thickness while preserving the surface morphology of the epilayer and preventing excessive roughness. Moreover, the embodiments herein provide BPD-free epilayer while using any method to grow the epilayer.

Figure 2E:
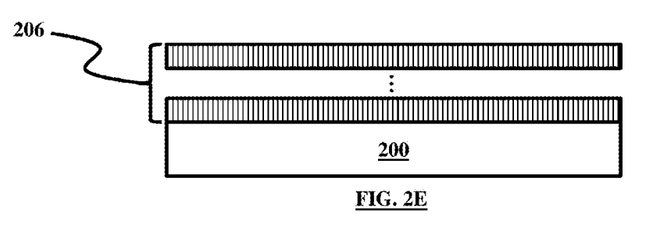
FIG. 2E is a schematic diagram illustrating an annealed substrate with multiple epilayers growths according to an embodiment herein.

Referring to FIG. 2D, the epilayer 204 may, for example, be grown to any desired thickness, using chemical vapor deposition (CVD) growth, with no specific attempt to suppress BPD propagation into the epilayer 204. In an embodiment, the epilayer 204 is at least 20 µm thick. FIG. 2E is a schematic diagram illustrating successive epilayers 206 grown on the substrate 200. In an embodiment, each successive epilayer 206 is grown using CVD growth. In an embodiment, each successive epilayer 206 is grown with no specific attempt to suppress BPD propagation into the successive epilayer. The process of growing the epilayer 204 may be referred to as epigrowth.

In an embodiment, epigrowth on the annealed and un-annealed samples may be performed concurrently. For example, referring to FIG. 1A, epigrowth on all the quarters 102, 104, 106, and 108 may be performed concurrently. However, in an embodiment BPD densities may vary from one quarter to another quarter in the SiC wafer. Hence, for example, epilayers may be grown on an adjacent wafer from the same boule, in which the annealing conditions were changed on each of the quarters 102, 104, 106, and 108 shown in FIG. 1A, or quarters 152, 154, 156, and 158 shown in FIG. 1B. Table 1 shows an example for the annealing conditions for the two wafers 100, 150.

TABLE 1

Substrate annealing conditions for the various quarters of two SiC sister wafers:

| Quarter | Wafer I | Wafer II |
|---|---|---|
| 102 (Wafer I)/152 (Wafer II) | No anneal | 1950° C./10 min anneal |
| 104 (Wafer I)/154 (Wafer II) | 1750° C./10 min anneal | 1850° C./10 min anneal |
| 106 (Wafer I)/156 (Wafer II) | 1850° C./10 min anneal | 1750° C./10 min anneal |
| 108 (Wafer I)/158 (Wafer II) | 1950° C./10 min anneal | No anneal |

Ultraviolet photoluminescence (UVPL) imaging may be performed on all the grown epilayers to observe all the BPDs that propagated into the epilayers from the substrate, and correlate their densities to the annealing conditions. Atomic force microscopy (AFM) may be performed on the epilayers to measure their surface roughness.

Figure 3:
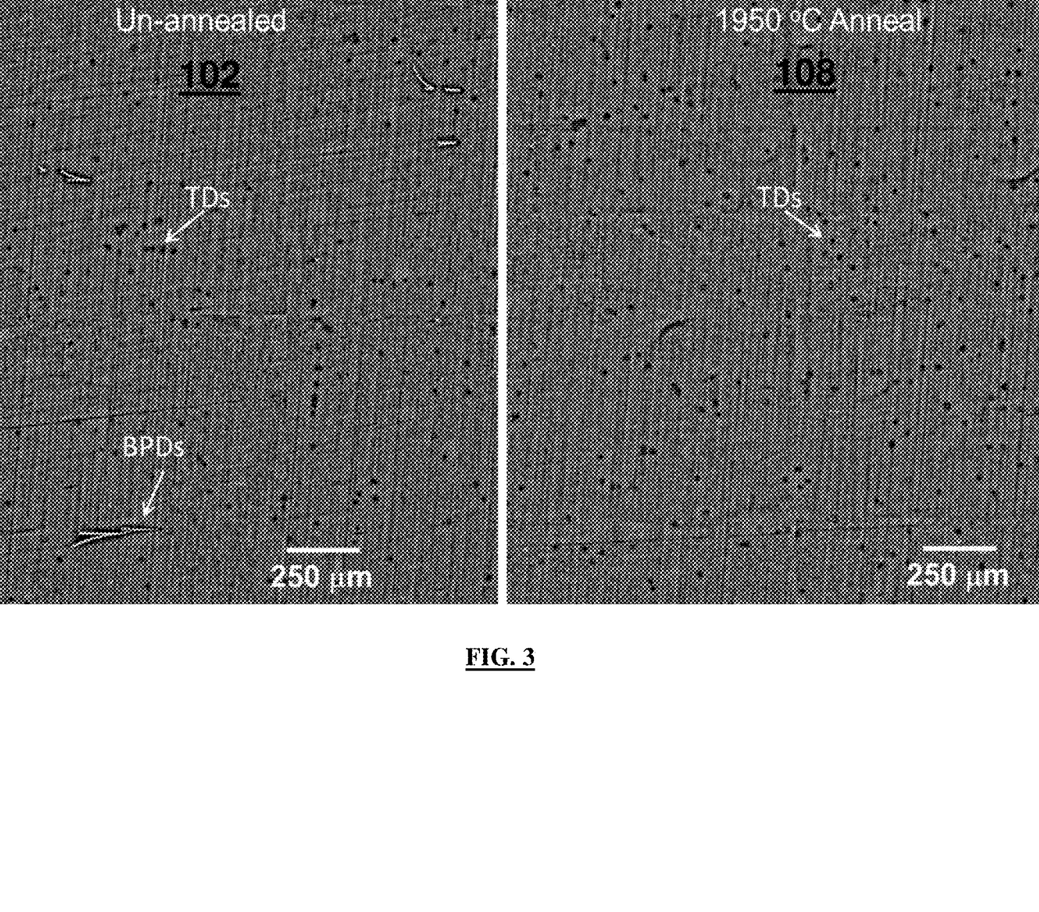
FIG. 3 illustrates ultraviolet photoluminescence (UVPL) images of SiC epilayers grown on an un-annealed and a 1950° C. annealed substrates of a wafer according to an embodiment herein.

FIG. 3, with reference to FIGS. 1A through 2E, illustrates UVPL images of SiC epilayers grown on un-annealed and 1950° C. annealed substrates in wafer 100 of FIG. 1A according to an embodiment herein. FIG. 3 shows the comparison between un-annealed quarter 102 and the 1950° C. annealed quarter 108 from wafer 100 of FIG. 1A according to an embodiment herein. A variety of BPD lengths are observed indicating their spontaneous conversion to TEDs occurring at various times during epigrowth. Un-annealed quarter 102 and quarter 104 annealed at 1750° C. (not shown in FIG. 3) have a similar BPD density. In quarter 106 annealed at 1850° C. and quarter 108 annealed at 1950° C. (shown in FIG. 3), the BPD density is reduced in the epilayers, as illustrated in FIG. 3. It is also observed that the substrates annealed at the higher temperatures have a higher density of threading dislocations (TDs) in the epitaxial layers, which appear as dots in the UVPL images in FIG. 3. This suggests that, for the higher temperature annealing, more BPDs in the substrate are converted to TEDs before reaching the substrate surface. The annealed samples appear to have a higher density of TDs as a result of more conversion of BPDs to TEDs in the substrates.

Figure 4A:
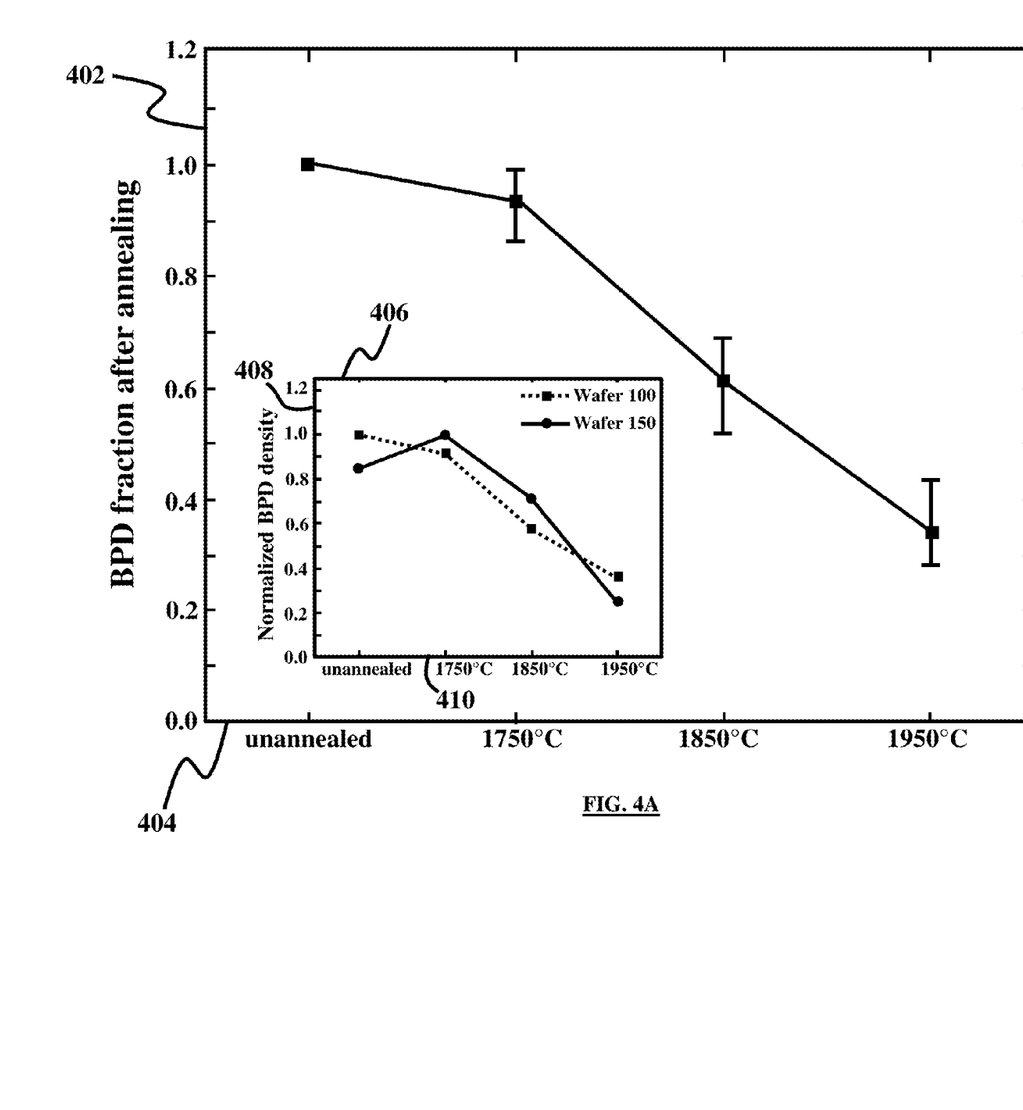
FIG. 4A is a graphical representation illustrating BPD fraction after annealing versus annealing temperatures according to an embodiment herein.

FIG. 4A, with reference to FIGS. 1A through 3, is a graphical representation illustrating BPD fraction after annealing with annealing temperatures according to an embodiment herein. The graph in FIG. 4A represents a calculation to separate the annealing-induced reduction of BPDs at the substrate surface from the BPD density variations among the four quarters 102, 104, 106, and 108 as illustrated in the wafer 100 of FIG. 1A, and compares it with the four quarters 152, 154, 156, and 158 as illustrated in the wafer 150 of FIG. 1B.

In FIG. 4A, the y-axis 402 illustrates the fractions of BPDs after annealing along with the calculated error bars for each of the four quarters of the wafer 100 as indicated on the x-axis 404. The inset graph 406 in FIG. 4A shows the normalized BPD density from each of the wafers 100, 150, and more particularly the inset graph 406 shows the variation in BPD density in epilayers grown from the two wafers 100, 150. The y-axis 408 shows the BPD density and the x-axis 410 shows the corresponding quarter on each of the wafers 100, 150.

FIG. 4A shows that BPD density may be reduced by approximately three (3) times by annealing the substrate at 1950° C., and approximately 1.6 times by annealing at 1850° C., whereas no significant reduction is obtained by annealing at 1750° C. BPD density is normalized in the inset graph 406 for each wafer 100, 150 and for each annealing condition using the factors influencing BPD density in the epilayers.

Figure 4B:
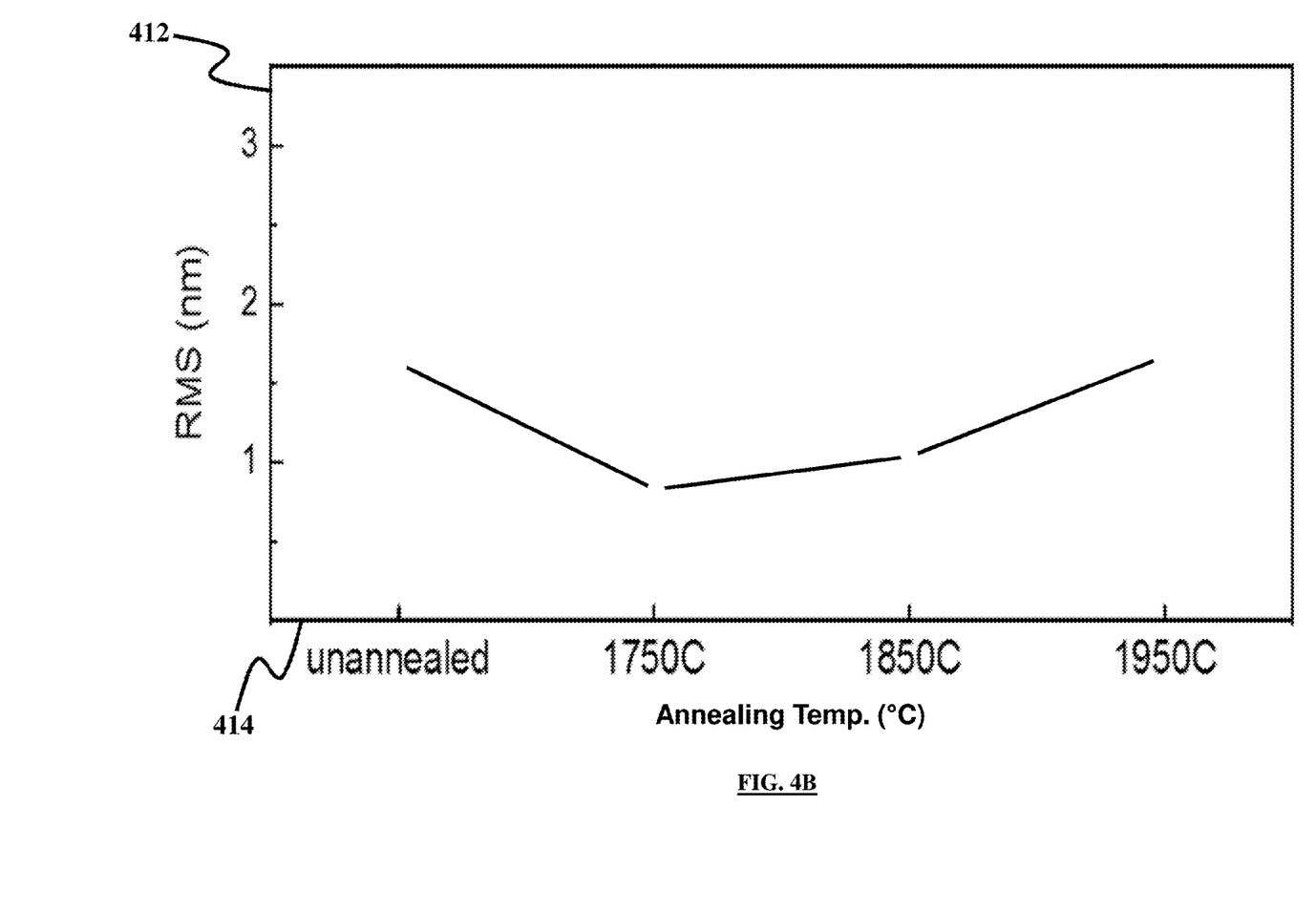
FIG. 4B is a graphical representation illustrating surface roughness of an epilayer versus annealing temperatures of a substrate underlying the epilayer according to an embodiment herein.

FIG. 4B, with reference to FIGS. 1A through 4A, is a graphical representation illustrating the roughness of surface 205 of the epilayer 204 versus annealing temperatures of the substrate 200, according to an embodiment herein. The y-axis 412 illustrates the root mean square (RMS) of roughness of surface 205 of the epilayer 204. The x-axis 414 illustrates the annealing temperature for removing BPDs from the surface 201 of the substrate 200 according to the embodiments herein. The graph in FIG. 4B illustrates that the mean roughness for the surface 205 of the epilayer 204 are similar at approximately 1.5 nm when the epilayer 204 is grown on the substrate 200 annealed at different temperatures. FIG. 4B illustrates that the annealing process of the substrate 200 does not cause deterioration to surface 205 of the epilayer 204 grown on the substrate 200.

Figure 5:
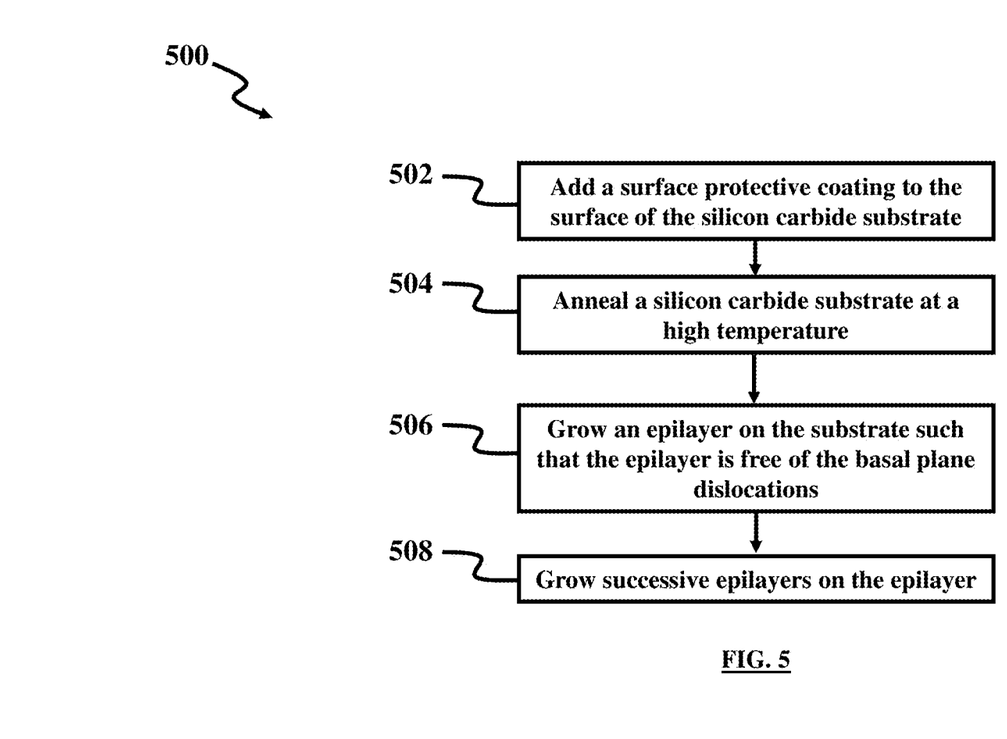
FIG. 5 is a flow diagram illustrating a method according to an embodiment herein.

FIG. 5, with reference to FIGS. 1A to 4B, is a flow diagram illustrating a method 500 for removing basal plane dislocations from a surface 201 of a silicon carbide substrate 200 according to an embodiment herein. At step 502, a surface protective coating 202 is added to the surface 201 of the silicon carbide substrate 200. At step 504, the silicon carbide substrate is annealed at a high temperature. In an embodiment, the substrate 200 is annealed at 1850° C. or higher. The annealing process removes BPDs from the surface 201 of the substrate 200. The annealing embeds the BPDs below the surface 201 of the substrate 200 by gliding the BPDs into the substrate 200 below the surface 201, and resulting in conversion of the BPDs to TDs at the surface 201 of the substrate 200.

At step 506, an epilayer 204 is grown on the surface 201 of the substrate 200. Because the surface 201 is free of BPDs, the epilayer 204 will also be free of the basal plane dislocations. In an embodiment, the basal plane dislocations are converted to threading edge dislocations in the epilayer 204. The embodiments herein allow for any method of growing the epilayer 204, and any desired thickness of the epilayer 204, without a need for suppressing BPDs in the epilayer 204. The embodiments herein also eliminate the need for further processing the epilayer 204 for removal of the BPDs. For example, the method 500 eliminates a need for further annealing the epilayer 204 for removing the BPDs from the epilayer, therefore using the method 500 the morphology of the surface 205 of the epilayer 204 is preserved and excessive roughness in the surface 205 is prevented.

In an embodiment, by annealing the substrate 200 before growing the epilayer 204, the method 500 prevents propagation of the basal plane dislocations from the silicon carbide substrate 200 into the epilayer 204. In an embodiment, only the TDs on the surface 201 of the annealed substrate 200 may continue as TDs in the substrate 204.

At step 508, successive epilayers 206 may be grown on the epilayer 204. Successive epilayers 206 grown using the method 500 will be free from BPDs. In an embodiment, the TDs in the epilayer 204 propagate as successive TDs in the successive epilayers 206 during the growing the successive epilayers 206.

The embodiments herein provide for the conversion of BPDs to TDs, and embedding BPDs within the SiC substrate material, while maintaining good surface morphology of an epilayer grown on the substrate. Further, BPD-free SiC epilayers with any desired thickness can be grown on substrates processed using the embodiments herein. Compared to conventional methods, high temperature annealing of SiC substrate material as provided by the embodiments herein is achieved with no silicon sublimation from the surface, therefore using the technique herein prevents surface degradation. Higher temperature annealing as provided by the embodiments herein may be used to improve the lifetime of SiC substrate material.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method for reducing basal plane dislocations on a surface of a silicon carbide substrate to propagate to a first epilayer grown on the substrate, said method comprising:
    adding a protective layer on said surface of said substrate, wherein said surface of said substrate has a number of basal plane dislocations;
    annealing said substrate at a temperature approximately greater or equal to 1850° C., wherein said annealing embeds said basal plane dislocations within said substrate and below said surface of said substrate;
    removing said protective layer from said surface of said substrate after said annealing; and
    growing a first epilayer on said substrate after said removing of said protective layer,
    wherein said first epilayer is grown without attempting to prevent said basal plane dislocations to propagate in said first epilayer when growing said first epilayer, and
    wherein said first epilayer has up to three times less basal plane dislocations propagating from said surface of said substrate.

2. The method of claim 1, wherein said protective layer comprises a carbon layer.

3. The method of claim 1, wherein said silicon carbide substrate comprises a 4° offcut, with an approximately 100 mm diameter, n-type 4H-SiC substrate.

4. The method of claim 1, wherein the growing of said first epilayer comprises using a chemical vapor deposition growth process.

5. The method of claim 1, wherein said first epilayer is at least approximately 20 μm thick.

6. The method of claim 1, wherein said annealing to approximately greater or equal to 1850° C. further comprises annealing said substrate for approximately 10 minutes in an induction high temperature furnace with Ar ambient at approximately 200 Torr.

7. The method of claim 1, further comprising growing a second epilayer on said first epilayer, wherein said second epilayer is grown without attempting to prevent said basal plane dislocations to propagate in said second epilayer when growing said first epilayer, and wherein said second epilayer is free of said basal plane dislocations.

8. The method of claim 7, wherein the growing of said second epilayer comprises using a chemical vapor deposition growth process.

9. The method of claim 7, wherein said second epilayer is at least approximately 20 µm thick.

10. A method for reducing basal plane dislocations on a surface of a silicon carbide substrate to propagate to an epilayer grown on the substrate, said method comprising:
   adding a surface protective layer on said surface of said substrate, wherein said surface of said substrate has a number of basal plane dislocations;
   annealing said substrate at a temperature approximately greater or equal to 1850° C., wherein said annealing embeds said basal plane dislocations within said substrate and below said surface of said substrate; and
   growing a first epilayer on said substrate after said annealing, wherein after said annealing said first epilayer has up to three times less basal plane dislocations propagating from said surface of said substrate.

11. The method of claim 10, wherein said basal plane dislocations propagate as threading edge dislocations in said first epilayer during said growing of said first epilayer in any desired thickness of said first epilayer.

12. The method of claim 11, wherein said thickness of said first epilayer is at least approximately 10 µm.

13. The method of claim 10, wherein a roughness of a surface of said epilayer is preserved.

14. The method of claim 10, further comprising growing a second epilayer on said first epilayer, wherein said threading edge dislocations in said first epilayer propagate as successive threading edge dislocations in said second epilayer during said growing of said second epilayer.

15. The method of claim 14, wherein the growing of said first epilayer and the growing of said second epilayer comprises using a chemical vapor deposition growth process.

16. The method of claim 10, wherein said annealing to approximately greater or equal to 1850° C. further comprises annealing said substrate for approximately 10 minutes in an induction high temperature furnace with Ar ambient at approximately 200 Torr.

17. A device comprising:
   a silicon carbide substrate, wherein the substrate comprises basal plane dislocations, and wherein said basal plane dislocations are embedded below a surface of said substrate by annealing said substrate at approximately at least 1850° C.; and
   a first epilayer on said silicon carbide substrate, wherein said first epilayer is grown on said substrate after said annealing of said substrate, and wherein said first epilayer has up to three times less basal plane dislocations propagating from said surface of said substrate.

18. The device of claim 17, wherein said basal plane dislocations in said substrate are converted to threading edge dislocations within said first epilayer growth.

19. The device of claim 17, further comprising a second epilayer over said first epilayer, wherein said second epilayer is free from said basal plane dislocations.

20. The device of claim 17, wherein said first epilayer is at least approximately 10 µm thick.

* * * * *